(12) United States Patent
Okano et al.

(10) Patent No.: US 12,061,238 B2
(45) Date of Patent: Aug. 13, 2024

(54) BATTERY TYPE DETERMINING DEVICE AND BATTERY TYPE DETERMINING METHOD

(71) Applicant: HONDA MOTOR CO., LTD., Tokyo (JP)

(72) Inventors: Jun Okano, Wako (JP); Tsubasa Uchida, Tokyo (JP); Yuki Tominaga, Wako (JP); Yukiko Onoue, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 141 days.

(21) Appl. No.: 17/960,899

(22) Filed: Oct. 6, 2022

(65) Prior Publication Data

US 2023/0120475 A1 Apr. 20, 2023

(30) Foreign Application Priority Data

Oct. 19, 2021 (JP) ................................ 2021-170979

(51) Int. Cl.
*G01R 31/382* (2019.01)
(52) U.S. Cl.
CPC ................................ *G01R 31/382* (2019.01)
(58) Field of Classification Search
CPC ................................................... G01R 31/382
See application file for complete search history.

(56) References Cited

U.S. PATENT DOCUMENTS 5,429,889 A * 7/1995 Tu Xuan ............... H01M 10/54
429/90
6,236,186 B1 * 5/2001 Helton ................ H02J 7/00038
320/106

(Continued)

FOREIGN PATENT DOCUMENTS

JP 02-013232 1/1990
JP 2003-257497 9/2003

(Continued)

OTHER PUBLICATIONS

Japanese Office Action for Japanese Patent Application No. 2021-170979 mailed Jun. 27, 2023.

*Primary Examiner* — Walter L Lindsay, Jr.
*Assistant Examiner* — Milton Gonzalez
(74) *Attorney, Agent, or Firm* — Amin, Turocy & Watson, LLP

(57) ABSTRACT

Provided is a battery type determining device including: an output controller configured to instruct a current application circuit to apply a specific current to a battery having a current collector and a wound body or laminate; a magnetic field characteristic measurer configured to measure a magnetic field characteristic generated in the battery when the current is applied from the output controller; a storage unit configured to store a specified value of the magnetic field characteristic in accordance with a type of the battery; and a determiner configured to compare the specified value with a measured value of the magnetic field characteristic measurer to determine the type of the battery, wherein the magnetic field characteristic measurer measures a magnetic field generated by an electric current flowing through the current collector of the battery.

9 Claims, 13 Drawing Sheets

(56) References Cited

U.S. PATENT DOCUMENTS

| | | | | |
|---|---|---|---|---|
| 6,285,185 B1* | 9/2001 | Asjes | ................... | H01M 10/48 |
| | | | | 324/239 |
| 2013/0057288 A1* | 3/2013 | Ogata | ................... | G01R 33/02 |
| | | | | 324/426 |
| 2015/0123669 A1 | 5/2015 | Tang et al. | | |
| 2016/0374392 A1 | 12/2016 | Liu | | |
| 2022/0166235 A1* | 5/2022 | Brozek | ................ | H02J 7/0047 |

FOREIGN PATENT DOCUMENTS

| | | |
|---|---|---|
| JP | 2010-246219 | 10/2010 |
| JP | 2015-524142 | 8/2015 |
| WO | 2013/165597 | 11/2013 |
| WO | 2015/133068 | 9/2015 |

\* cited by examiner

BATTERY TYPE DETERMINING DEVICE AND BATTERY TYPE DETERMINING METHOD

CROSS-REFERENCE TO RELATED APPLICATION

Priority is claimed on Japanese Patent Application No. 2021-170979, filed Oct. 19, 2021, the content of which is incorporated herein by reference.

BACKGROUND

Field of the Invention

The present invention relates to a battery type determining device and a battery type determining method.

Description of Related Art

Conventionally, a method for identifying a type of a battery based on a direct current internal resistance at the time of charging the battery and a direct current internal resistance at the time of discharging the battery is known (International Publication No. 2015/133068). In such a method, a resistor having a predetermined resistance value is attached to the battery, and the resistance value is measured at the time of identification, thereby determining the type of the battery. In addition, there is also a method in which an IC chip is attached to a battery and the type of the battery is determined based on an identification signal output by the IC chip.

SUMMARY

However, in the conventional technique, it is necessary to attach components such as a resistor or an IC chip to a battery, which incurs costs. In addition, if imitations of these components are made, they will be attached to an unintended battery and the type of battery cannot be correctly identified.

The present invention has been made in consideration of such circumstances, and an object thereof is to provide a battery type determining device and a battery type determining method in which a type of a battery can be determined without attaching an identification component.

A battery type determining device and a battery type determining method according to the present invention have the following configurations.

(1) A battery type determining device according to one aspect of the present invention includes: a storage device configured to store a program and a specified value of a magnetic field characteristic in accordance with a type of a battery; a hardware processor; and a magnetic field characteristic measuring device configured to measure the magnetic field characteristic generated in the battery, wherein the hardware processor executes the program stored in the storage device to instruct a current application circuit to apply a specific current to the battery having a current collector and a wound body or laminate, causes the magnetic field characteristic measuring device to measure the magnetic field characteristic generated in the battery due to the application of the specific current, and compares the specified value with a measured value of the magnetic field characteristic measuring device to determine the type of the battery, and the magnetic field characteristic measuring device measures a magnetic field generated by an electric current flowing through the current collector of the battery.

(2) In the above aspect (1), the magnetic field characteristic measuring device measures the magnetic field generated by the electric current flowing through a connection portion between the current collector and the wound body or laminate.

(3) A battery type determining device according to one aspect of the present invention includes: a storage device configured to store a program and a specified value of a magnetic field characteristic in accordance with a type of a battery cell group; a hardware processor; and a magnetic field characteristic measuring device configured to measure the magnetic field characteristic generated in the battery cell group in which battery cells each having a current collector and a wound body or laminate are laminated in a predetermined direction, wherein the hardware processor executes the program stored in the storage device to instruct a current application circuit to apply a specific current to the battery cell group, causes the magnetic field characteristic measuring device to measure the magnetic field characteristic generated in the battery cell group due to the application of the specific current, and compares the specified value with a measured value of the magnetic field characteristic measuring device to determine the type of the battery cell group, and the magnetic field characteristic measuring device is disposed in a region in which a magnetic field generated by an electric current flowing through current collectors of adjacent battery cells is amplified.

(4) In any of the above aspects (1) to (3), the battery or the battery cell group, the magnetic field characteristic measuring device, and the hardware processor are mounted on a mobile object, the magnetic field characteristic measuring device records a previous magnetic field characteristic measured when electric power of the mobile object is turned off and measures a current magnetic field characteristic when the electric power is turned on next, and the hardware processor compares the previous magnetic field characteristic with the current magnetic field characteristic to detect a change in the battery or the battery cell group.

(5) In any of the above aspects (1) to (4), the specific current is a sine wave or a square wave.

(6) A battery type determining method according to one aspect of the present invention including steps, executed by a computer, of: instructing a current application circuit to apply a specific current to a battery having a current collector and a wound body or laminate; causing a magnetic field characteristic measuring device to measure a magnetic field characteristic generated in the battery due to the application of the current; comparing a specified value of the magnetic field characteristic in accordance with a type of the battery with a measured value of the magnetic field characteristic generated in the battery due to application of the current to determine the type of the battery; and causing the magnetic field characteristic measuring device to measure a magnetic field generated by an electric current flowing through the current collector of the battery as the magnetic field characteristic.

(7) A battery type determining method according to one aspect of the present invention including steps, executed by a computer, of: instructing a current application circuit to apply a specific current to battery cell group in which battery cells each having a current collector and a wound body or laminate; causing a magnetic field characteristic measuring device to measure a magnetic field characteristic generated in the battery cell group due to the application of the current, and comparing a specified value of the magnetic field characteristic in accordance with a type of the battery cell group with a measured value of the magnetic field characteristic generated in the battery cell group due to application of the current to determine the type of the battery cell group; and causing the magnetic field characteristic measuring device to measure a magnetic field in a region in which a magnetic field generated by an electric current flowing through current collectors of adjacent battery cells is amplified as the magnetic field characteristic.

According to (1) to (7), the battery type determining device applies an electric current to a battery cell or a battery cell group (a battery), measures a magnetic field characteristic generated by the current, and compares a specified value of the magnetic field characteristic in accordance with a type of the battery cell or the battery cell group with a measured value of the magnetic field characteristic to determine the type of the battery cell or the battery cell group, and thus it is possible to determine the type of the battery without attaching an identification component.

DESCRIPTION OF EMBODIMENTS

Embodiments of a battery type determining device and a battery type determining method of the present invention will be described below with reference to the drawings.

First Embodiment

Figure 1:
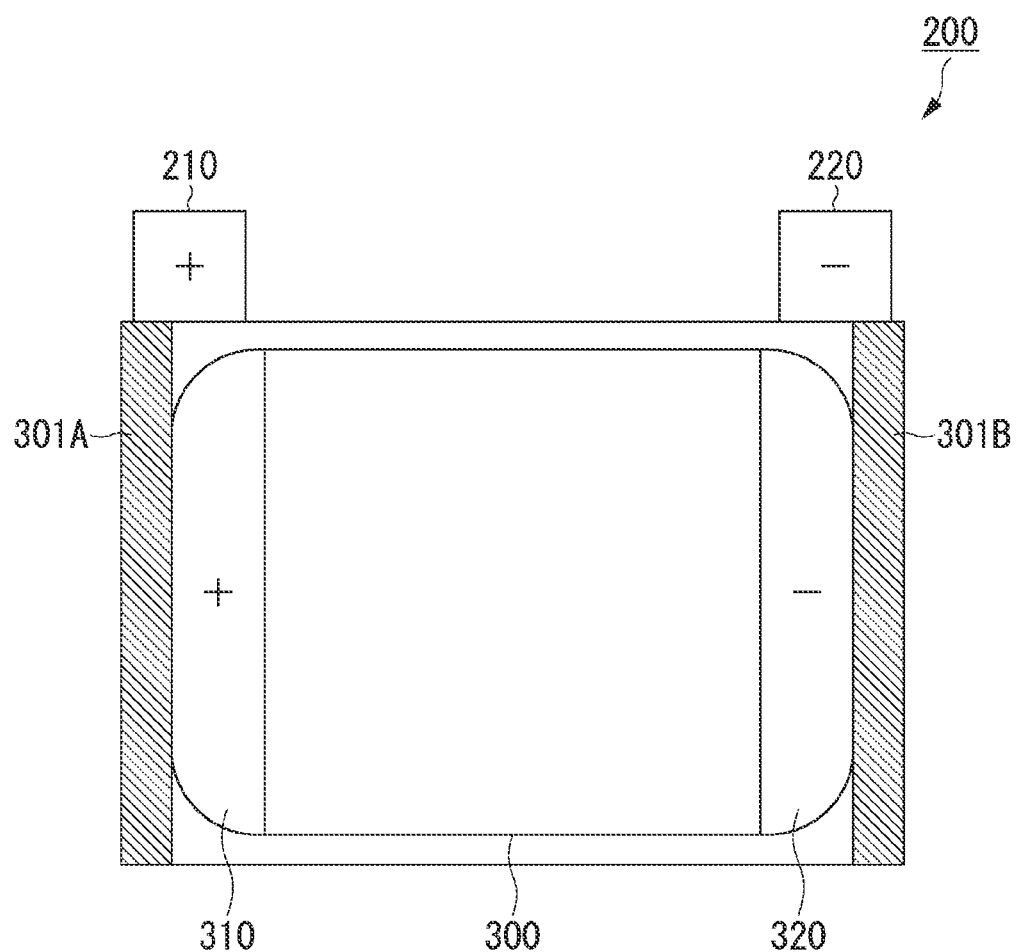
FIG. 1 is a diagram showing an outline of a configuration of a battery cell.
Figure 2:
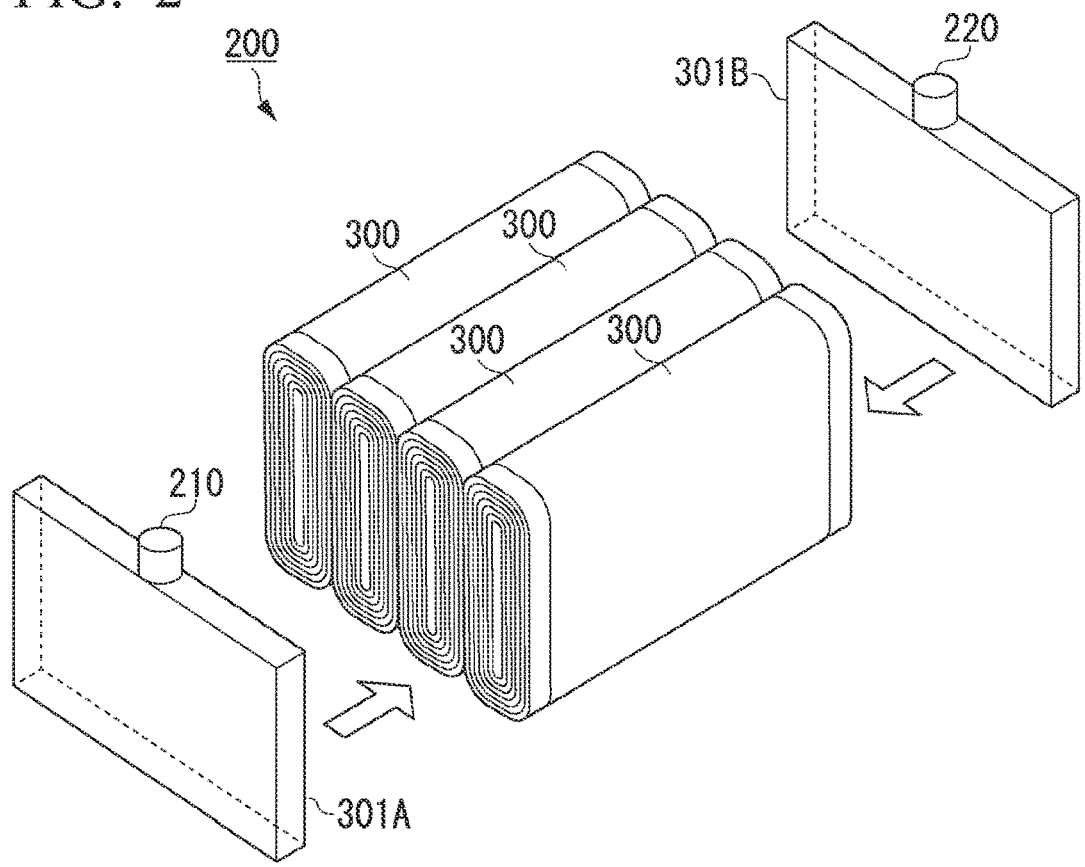
FIG. 2 is a diagram showing an outline of a current collecting mechanism of a battery group constituting the battery cell.
Figure 3:
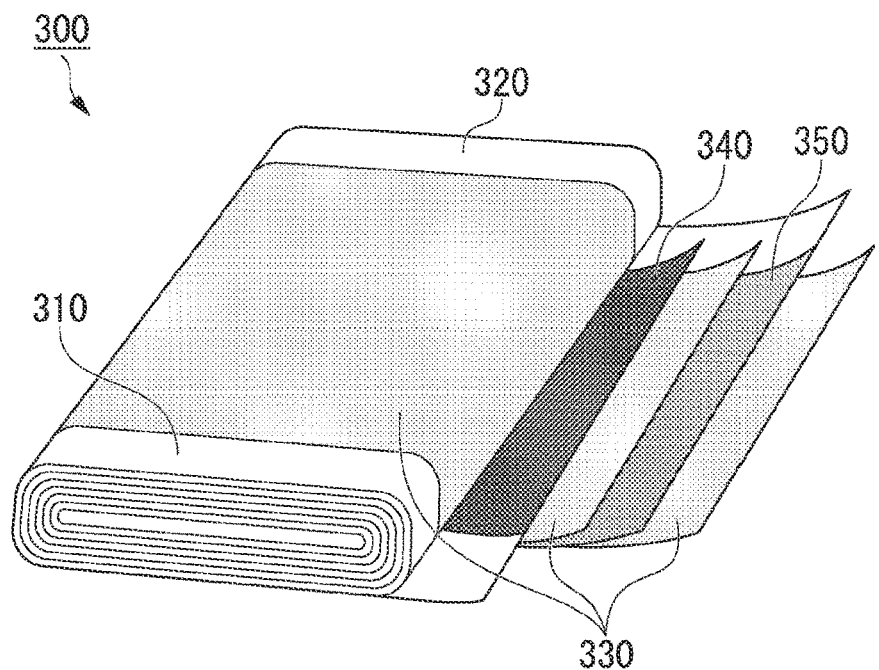
FIG. 3 is a diagram showing an outline of a configuration of a wound electrode body.

FIGS. 1 to 3 are diagrams showing an example of a battery cell according to the present embodiment. FIG. 1 shows an outline of a configuration of the battery cell 200, and FIG. 2 shows an outline of a current collecting mechanism of a battery group constituting the battery cell 200. FIG. 3 shows an outline of a battery mechanism of the battery cell 200. The battery cell 200 shown in FIG. 1 has one or more wound electrode bodies 300 (wound bodies) and an electrolytic solution (not shown) therein and includes a positive electrode terminal 210 and a negative electrode terminal 220.

In addition, as shown in FIG. 2, the battery cell 200 includes a positive electrode current collector 301A and a negative electrode current collector 301B that perform collecting electricity respectively from positive electrodes 340 and negative electrodes 350 (see FIG. 3) of one or more wound electrode bodies 300. The positive electrode current collector 301A is connected to a positive electrode terminal 210 of the battery cell 200, and the negative electrode current collector 301B is connected to a negative electrode terminal 220 of the battery cell.

Further, as shown in FIG. 3, each of the wound electrode bodies 300 includes a positive electrode tab 310, a negative electrode tab 320, separators 330, positive electrodes 340, and negative electrodes 350. The separators 330 are members that isolate the positive electrodes 340 and the negative electrodes 350, hold an electrolytic solution, and secure conductivity of ions between the positive electrodes 340 and the negative electrodes 350. The wound electrode body 300 is configured by laminating and winding the positive electrode tab 310, the negative electrode tab 320, the separators 330, the positive electrodes 340, and the negative electrodes 350 in the order shown in FIG. 3.

Figure 4:
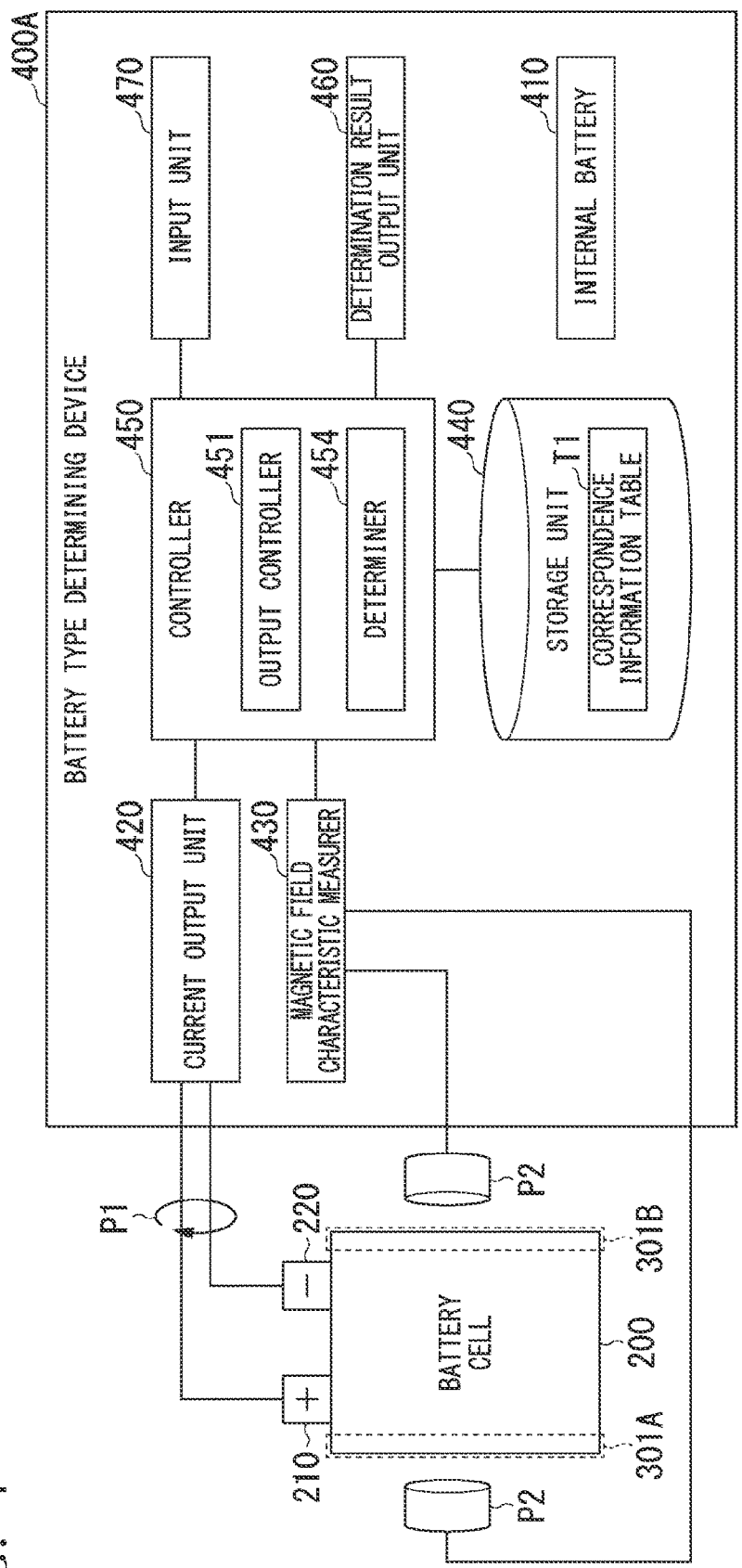
FIG. 4 is a diagram showing a configuration example of a battery type determining device according to a first embodiment.

FIG. 4 is a diagram showing a configuration example of a battery type determining device 400A according to the present embodiment. The battery type determining device 400A includes an internal battery 410, a current output unit 420, a magnetic field characteristic measurer 430, a storage unit 440, a controller 450, a determination result output unit 460, and an input unit 470. The controller 450 is realized by, for example, a hardware processor such as a central processing unit (CPU) executing a program (software). Some or all of these constituent elements may be realized by hardware (a circuit unit; including circuitry) such as large scale integration (LSI), application-specific integrated circuits (ASICs), field-programmable gate arrays (FPGAs), and graphics processing units (GPUs), or may be realized by software and hardware in cooperation. The program may be stored in advance in a storage device (a storage device including a non-transient storage medium) such as a hard disk drive (HDD) or a flash memory or may be stored in a removable storage medium (a non-transient storage medium) such as a DVD or a CD-ROM and installed by mounting the storage medium on a drive device.

The internal battery 410 is a battery that supplies electric power required for operations of the battery type determining device 400A. Each functional unit of the battery type determining device 400A can be operated by the electric power supplied by the internal battery 410. The internal battery 410 may be a battery or an interface that obtains electric power from another power source.

The current output unit 420 is a current application circuit controlled to apply a specific current to a target battery cell 200. The specific current is a current applied to the target battery cell 200 for the purpose of identifying a battery type of the target battery cell 200 (hereinafter referred to as "an identification current"). The current output unit 420 applies an electric current having an intensity instructed by the controller 450 to a target battery 100. The electric current output by the current output unit 420 is applied to the battery 100 via a probe P1.

The magnetic field characteristic measurer 430 is a circuit that measures a magnetic field characteristic of a measurement target based on a probe signal acquired by a magnetic field measurement probe P2. More specifically, in the battery type determining device 400A, the probe P2 scans the vicinity of the positive electrode current collector 301A and/or the negative electrode current collector 301B inside (or at a side surface portion) of the target battery cell 200 in accordance with an operation of a user. Hereinafter, unless otherwise specified, the positive electrode current collector 301A and/or the negative electrode current collector 301B will be described as a current collector 301. The magnetic field characteristic measurer 430 measures a magnetic field characteristic in the vicinity of the current collector 301 in a state in which a specific current is applied to the target battery cell 200 based on the probe signal acquired by scanning. It is assumed that timings at which the magnetic field characteristic measurer 430 measures the magnetic field characteristic of the target battery cell 200 are appropriately controlled by the controller 450 in accordance with application of the identification current. The magnetic field characteristic measurer 430 outputs a measured value of the magnetic field characteristic of the target battery cell 200 to the controller 450.

The storage unit 440 is configured by using, for example, a magnetic storage device such as a hard disk drive (HDD) or a semiconductor storage device such as a solid state drive (SSD). The storage unit 440 stores various types of information regarding the operations of the battery type determining device 400A. For example, the storage unit 440 stores measurement data of the magnetic field characteristic of the target battery cell 200, information indicating determination results of the battery type, setting information of the electric current applied to the target battery cell 200, various types of program data for realizing the controller 450, and the like. The storage unit 440 stores correspondence information in advance, which will be described later.

The controller 450 controls each functional unit of the battery type determining device 400A so that the battery type determining device 400A can determine the battery type of the target battery 100. Specifically, the controller 450 includes an output controller 451 and a determiner 454.

The output controller 451 has a function of applying the identification current to the target battery cell 200 by controlling an output intensity of the current output unit 420. For example, the output controller 451 can apply an alternating current that changes in a sine wave shape to the target battery cell 200 by continuously changing the output intensity of the current output unit 420. The output controller 451 can also output and apply a direct current that changes in a rectangular wave shape to the target battery cell 200 by changing the output intensity of the current output unit 420 at predetermined timings.

The output controller 451 may be configured to detect that the target battery cell 200 has been connected to the battery type determining device 400A and start applying the identification current to the target battery cell 200. In a case in which the battery type determining device 400A includes an input device such as a mouse or a keyboard, the output controller 451 may be configured to start applying the identification current to the target battery cell 200 in accordance with an input operation of the user.

The determiner 454 determines the battery type of the target battery cell 200 based on a magnetic field characteristic value in the vicinity of the current collector 301 acquired for the target battery cell 200. Specifically, the determiner 454 determines the battery type of the target battery cell 200 based on the correspondence information in which the type of the battery and a magnetic field characteristic value in the vicinity of the current collector measured for each type of battery cell are associated with each other. It is assumed that the correspondence information is stored in the storage unit 440 in advance. The determiner 454 outputs information indicating determination results of the battery type performed on the target battery cell 200 (hereinafter referred to as "determination result information") to the determination result output unit 460.

The determination result output unit 460 outputs the determination result information output from the determiner 454 in a predetermined mode. For example, the determination result output unit 460 may include display devices such as a liquid crystal display and an organic electro-luminescence (EL) display and display the determination result information on these display devices. For example, the determination result output unit 460 may include a wired or wireless communication interface and may transmit determination result information to other communication devices via the communication interface. The determination result output unit 460 may include a voice output device such as a speaker and may output a voice indicating the content of the determination result information to the voice output device.

The input unit 470 has a function of inputting information regarding the operations of the battery type determining device 400A. For example, the input unit 470 may include input devices such as a mouse and a keyboard and may be configured to input necessary information via these input devices. The input unit 470 includes a wired or wireless communication interface and may be configured to input necessary information via the communication interface. The input unit 470 outputs the input information to the controller 450.

Figure 5:
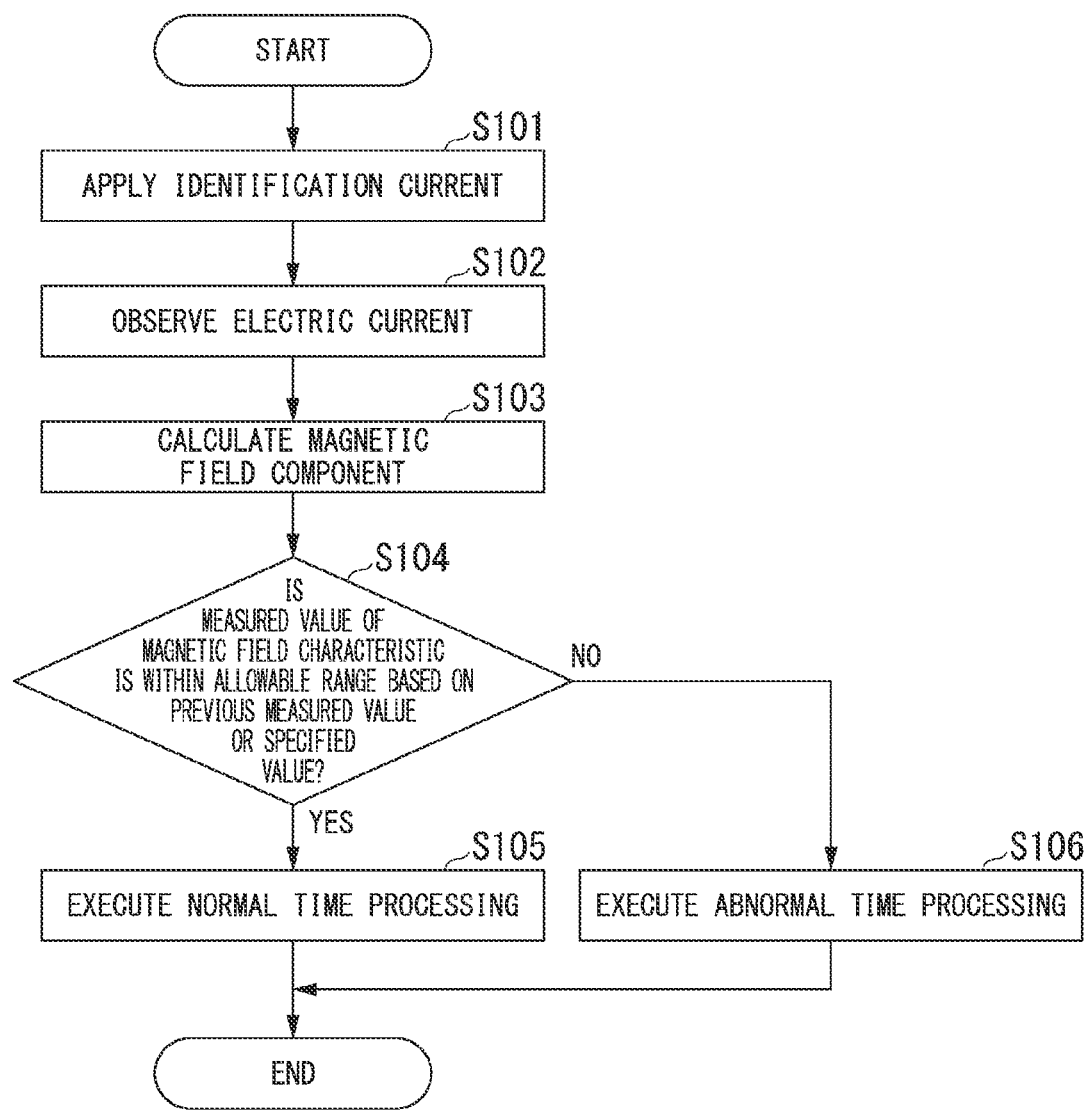
FIG. 5 is a flowchart showing an example of a process in which the battery type determining device according to the first embodiment determines a battery type of a target battery cell.

FIG. 5 is a flowchart showing an example of a process in which the battery type determining device 400A of the present embodiment determines the battery type of the target battery cell 200. Here, it is assumed that the battery type determining device 400A is in a state in which it has been connected to the battery cell 200 that is the determination target (target battery cell) at the start of the flowchart. First, in the battery type determining device 400A, an operation of applying the identification current to the target battery cell 200 is input via the input unit 470. In response to this operation input, the output controller 451 controls the current output unit 420 to apply the identification current to the target battery cell 200 (step S101).

Subsequently, the probe P2 outputs a probe signal according to the magnetic field characteristic in the vicinity of the current collector 301 (step S102). For the probe P2, a coil sensor, a lead sensor, a Hall element, a magnetoresistive (MR) sensor, a magneto-impedance (MI) sensor, and the like can be used. For example, the probe P2 outputs a probe signal indicating a current value induced by a magnetic field, and the magnetic field characteristic measurer 430 calculates a magnetic field component based on the current value indicated by the probe signal (step S103), thereby measuring the magnetic field characteristic.

Subsequently, the determiner 454 determines whether or not the target battery cell 200 is a legitimate battery cell based on measurement results of the magnetic field characteristic obtained by the magnetic field characteristic measurer 430. Specifically, the determiner 454 determines whether or not a measured magnetic field component is within an error range of a previous measured value or within a range of a predetermined specified value (step S104). If any of the above is applicable, it determines that the target battery cell 200 is a legitimate battery cell, and if none of the above is applicable, it determines that the target battery cell 200 is not a legitimate battery cell.

Here, in a case in which the target battery cell 200 is determined to be a legitimate battery cell (step S104—YES), the determiner 454 executes normal time processing (step S105). The normal time processing is processing of enabling the target battery cell 200, processing performed by using the target battery cell 200, and the like. On the other hand, in a case in which the target battery cell 200 is not determined to be a legitimate battery in step S104 (step S104-NO), the determiner 454 executes abnormal time processing (step S106). The abnormal time processing is a process of disabling the target battery cell 200, notifying that the target battery cell 200 is not a legitimate battery cell, and performing an operation such as a warning out of usage of the target battery cell 200, or the like.

The normal time processing may be any processing as long as it should be executed in a case in which the target battery 100 is a legitimate battery. Similarly, the abnormal time processing may be any processing as long as it should be executed when the target battery 100 is not a legitimate battery. For example, the determiner 454 may execute processing of demonstrating an original performance of a control system of a vehicle equipped with the target battery 100 as the normal time processing and may execute processing of limiting a performance that can be demonstrated by the vehicle as the abnormal time processing. According to such control, by limiting the performance that can be demonstrated by the vehicle in a case in which a non-genuine battery is used in a vehicle manufactured in-house, it is possible to prevent the vehicle from being endangered.

For example, the determiner 454 may execute processing of maintaining warranty of the vehicle for a system that manages the warranty of the vehicle equipped with the target battery 100 as the normal time processing and may execute processing of stopping the warranty of the vehicle as the abnormal time processing. According to such control, due to the warranty on accidents that occur in a vehicle that does not use a genuine battery, it is possible to prevent a manufacturer of the vehicle from being charged an unreasonable cost.

For example, the determiner 454 may execute processing of causing a statistical processing target to include vehicle data of the vehicle equipped with the target battery 100 for a system that analyzes the vehicle data collected by telematics and provides various services as the normal time processing and may execute processing of excluding the vehicle data from the statistical processing target as an abnormal time processing. According to such control, deterioration of reliability of statistical processing due to the vehicle data of the vehicle that does not use a genuine battery and deterioration of quality of service provision can be inhibited.

Such determination of the battery type and normal time processing or abnormal time processing in accordance with the determination results may be executed at the time of inspecting the vehicle on which the target battery 100 is mounted or may be executed at the time of starting the vehicle on which the target battery 100 is mounted.

Figure 6:
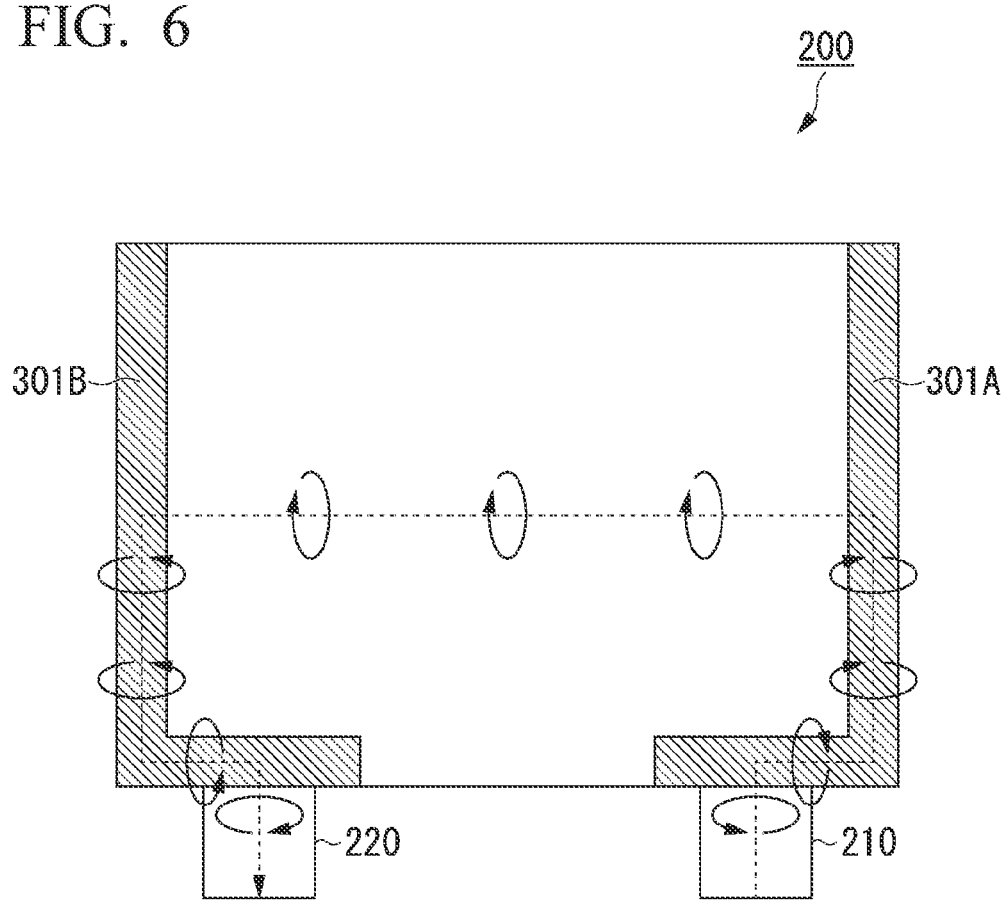
FIG. 6 is a diagram illustrating a state of a magnetic field characteristic in the vicinity of a current collector of the battery cell.
Figure 7:
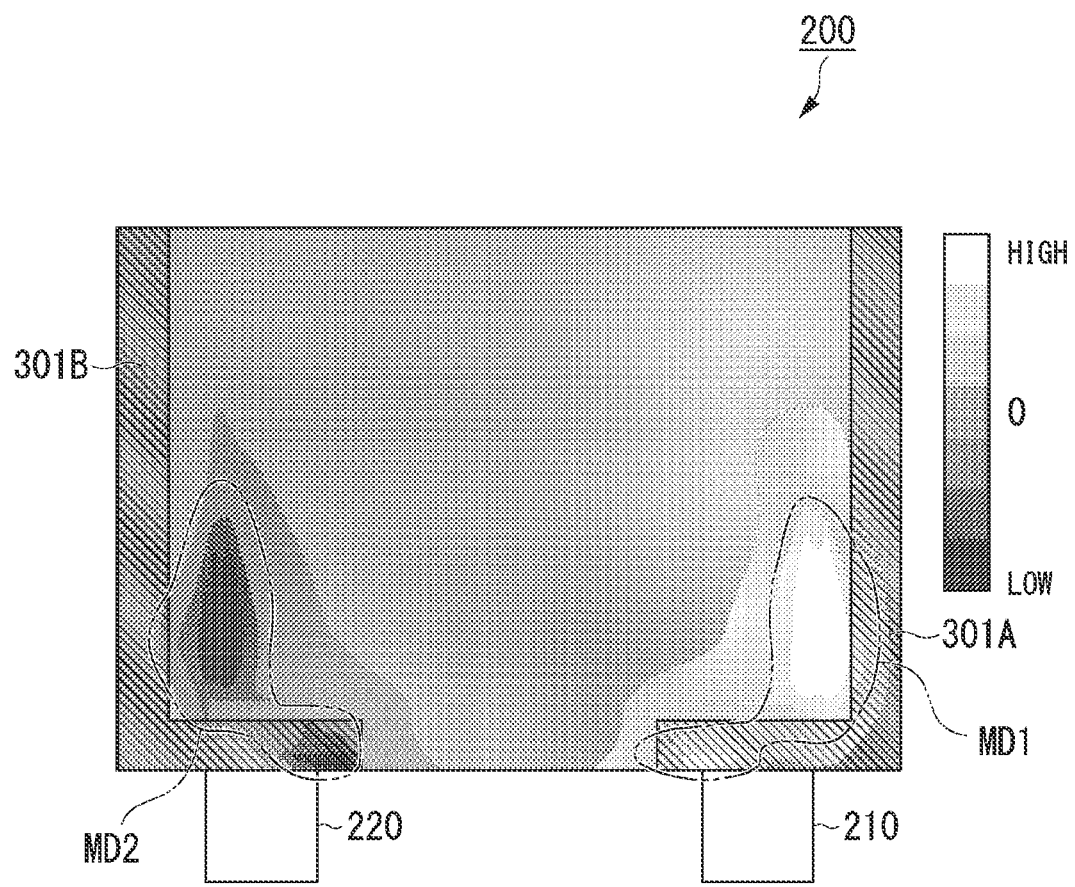
FIG. 7 is a diagram showing an example of measurement results of the magnetic field characteristic in the vicinity of the current collector of the battery cell obtained by the battery type determining device according to the first embodiment.

FIGS. 6 and 7 are diagrams showing an example of measurement results of the magnetic field characteristic in the vicinity of the current collector 301 of the battery cell 200 obtained by the battery type determining device 400A of the present embodiment. FIG. 6 shows an outline of a magnetic field generated by application of a measurement current, and FIG. 7 shows the measurement results. In FIG. 6, a dashed arrow represents a flow of the identification current. The identification current reaches the wound electrode body 300 from the positive electrode terminal 210 through the positive electrode current collector 301A, reaches the negative electrode current collector 301B through the wound electrode body 300, and reaches the negative electrode terminal 220 from the negative electrode current collector 301B. In this case, according to the right-handed screw rule, the magnetic field is generated in a circumferential direction with a direction of the identification current as an axis.

In this case, as shown in FIG. 7, it has been found that featured magnetic field characteristics MD1 and MD2 are formed in the vicinity of the positive electrode terminal 210 and the negative electrode terminal 220 of the battery cell 200 and in the vicinity of the positive electrode current collector 301A and the negative electrode current collector 301B close to them. Furthermore, it has been found that such magnetic field characteristics show a distribution in accordance with physical characteristics of a battery mechanism. That is, in a case in which places that show featured magnetic field characteristics (hereinafter referred to as "feature points") are known in advance, the battery type determining device 400A may measure the magnetic field at least for such feature points and does not necessarily need to measure the magnetic field for the entire surface region of the battery cell 200. For example, magnetic field sensors (corresponding to the probe P2) for determining the battery type may be attached in advance to the feature points of the battery cell 200. The battery type determining device 400A of the present embodiment acquires the magnetic field characteristics corresponding to such physical characteristics in advance and compares them with the magnetic field characteristics measured for the target battery cell 200, thereby determining the battery type of the target battery cell 200.

Figure 8:
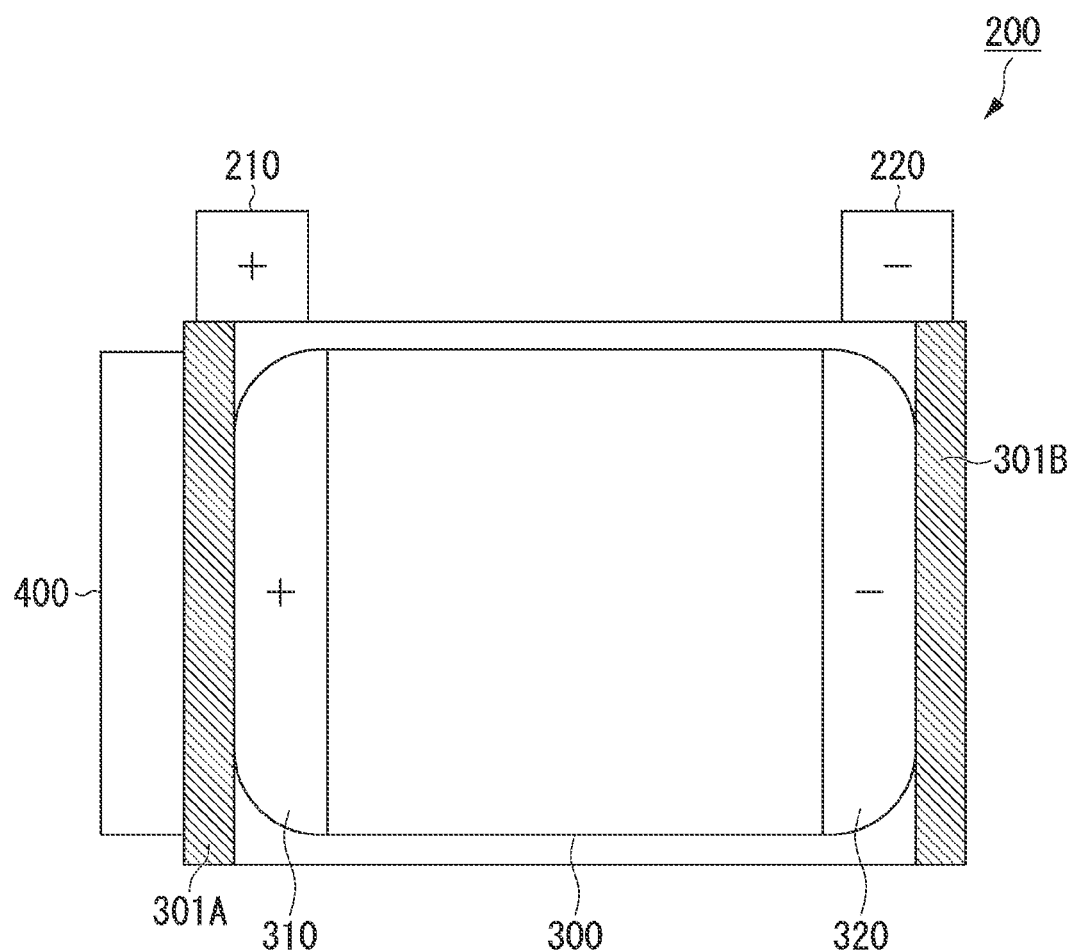
FIG. 8 is a diagram showing an application example of the battery type determining device according to the first embodiment.

FIG. 8 is a diagram showing an application example of the battery type determining device 400A of the first embodiment. FIG. 8 shows the battery cell 200 integrally configured with the battery type determining device 400A as the application example of the battery type determining device 400A. The example of FIG. 8 is an example in which the battery type determining device 400A is disposed on a side surface of the battery cell 200 near the positive electrode current collector 301A. This is disposed based on the assumption that the magnetic field is measured at a feature point in the vicinity of the positive electrode current collector 301A, and in this case, at least the probe P2 for measuring the magnetic field characteristics may be installed in the vicinity of the positive electrode current collector 301A, and the entire battery type determining device 400A does not necessarily have to be disposed on the side surface of the positive electrode current collector 301A. In the case of determining the battery type based on the magnetic field characteristics in the vicinity of the negative electrode current collector 301B, the probe P2 may be installed in the vicinity of the negative electrode current collector 301B. The probe P2 may be installed in the vicinity of both of the positive electrode current collector 301A and the negative electrode current collector 301B, and the battery type determining device 400A may determine the battery type based on the magnetic field characteristics of both of the current collectors 301. Not limited to the vicinity of the current collector 301, the magnetic field characteristics for determining the battery type may be measured at any feature point at which the battery type can be determined.

The battery type determining device 400A of the embodiment configured as described above can apply the specific current to the target battery 100 and determine the type of the target battery based on a magnetic field characteristic value observed as a response. For that reason, according to the battery type determining device 400A of the embodiment, it is possible to determine the type of the target battery 100 without attaching an identification component.

For example, if the magnetic field characteristic value generated by the application of the identification current indicates the feature that it is a genuine product, the battery type determining device 400A may be configured to determine whether the target battery cell 200 is a genuine product or a non-genuine product as the battery type. Further, if the magnetic field characteristic value indicates the feature of the battery cell 200 that differs depending on a vehicle type, the battery type determining device 400A may be configured to determine the vehicle type to which the target battery cell 200 should be mounted as the battery type. In addition, the battery type determining device 400A may be configured to identify other attributes of the target battery cell 200 as long as they are attributes that correlate with the magnetic field characteristic value generated by the application of the identification current.

Second Embodiment

Figure 9:
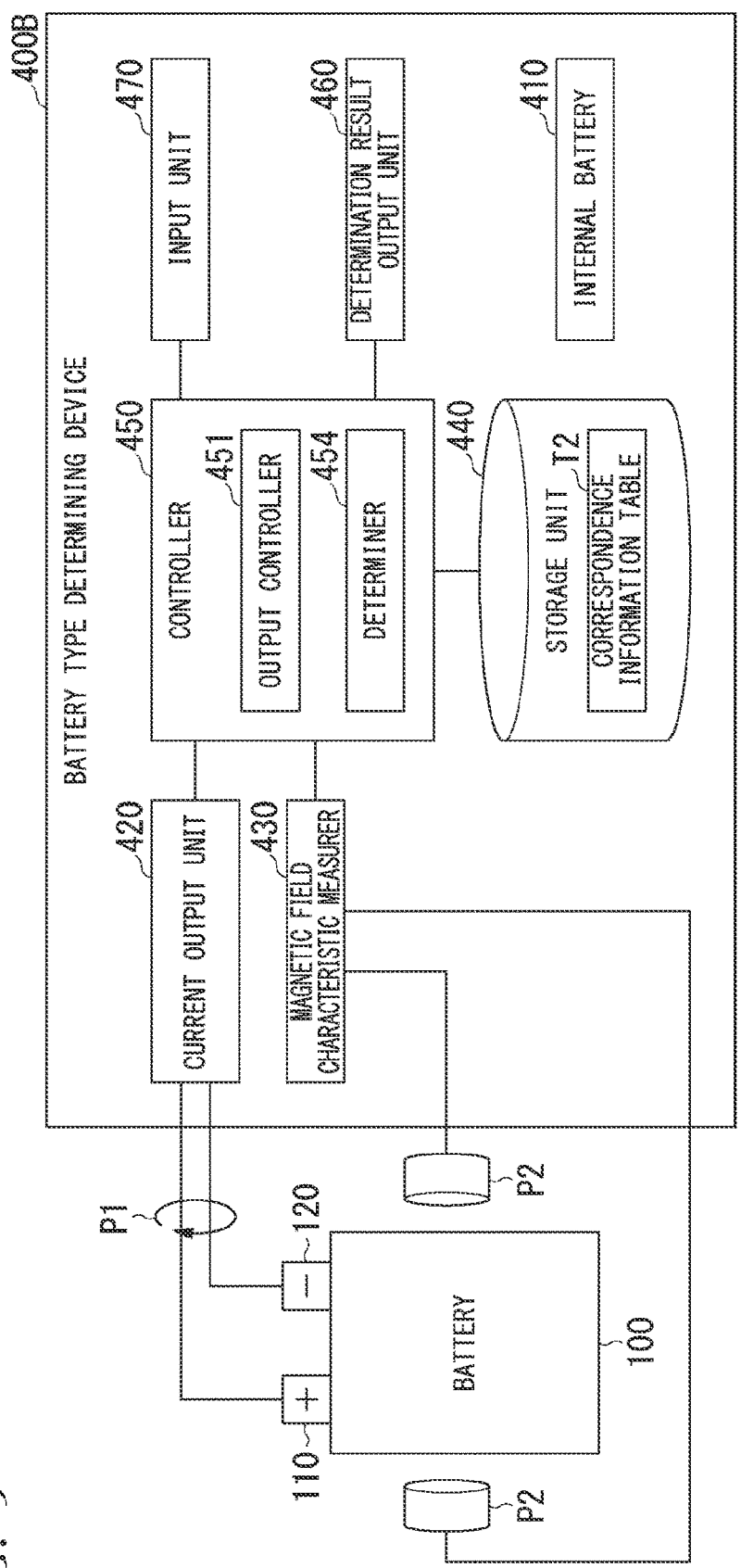
FIG. 9 is a diagram showing a configuration example of a battery type determining device according to a second embodiment.

In a second embodiment, a case in which a battery type determining device determines a battery type of a battery 100 in which battery cells 200 are integrated will be described. FIG. 9 is a diagram showing a configuration example of a battery type determining device 400B according to the second embodiment. The battery type determining device 400B is different from the battery type determining device 400A of the first embodiment in that a determination target of a battery type is the battery 100 instead of the battery cell 200, and a correspondence information table T2 is stored in a storage unit 440 instead of the correspondence information table T1. Other configurations are the same as those of the battery type determining device 400B of the first embodiment. For that reason, in FIG. 9, the same reference numerals as those in FIG. 4 are applied to the same configurations, and descriptions thereof will be omitted.

The correspondence information table T2 is the same as the correspondence information table T1 in that it is information used by the determiner 454 to determine the battery type, but is different from the correspondence information table T1 in that the correspondence information table T1 shows a correspondence relationship between the magnetic field characteristic of the battery cell 200 and the battery type, whereas the correspondence information table T2 shows a correspondence relationship between the magnetic field characteristic of the battery 100 and the battery type.

Figure 10:
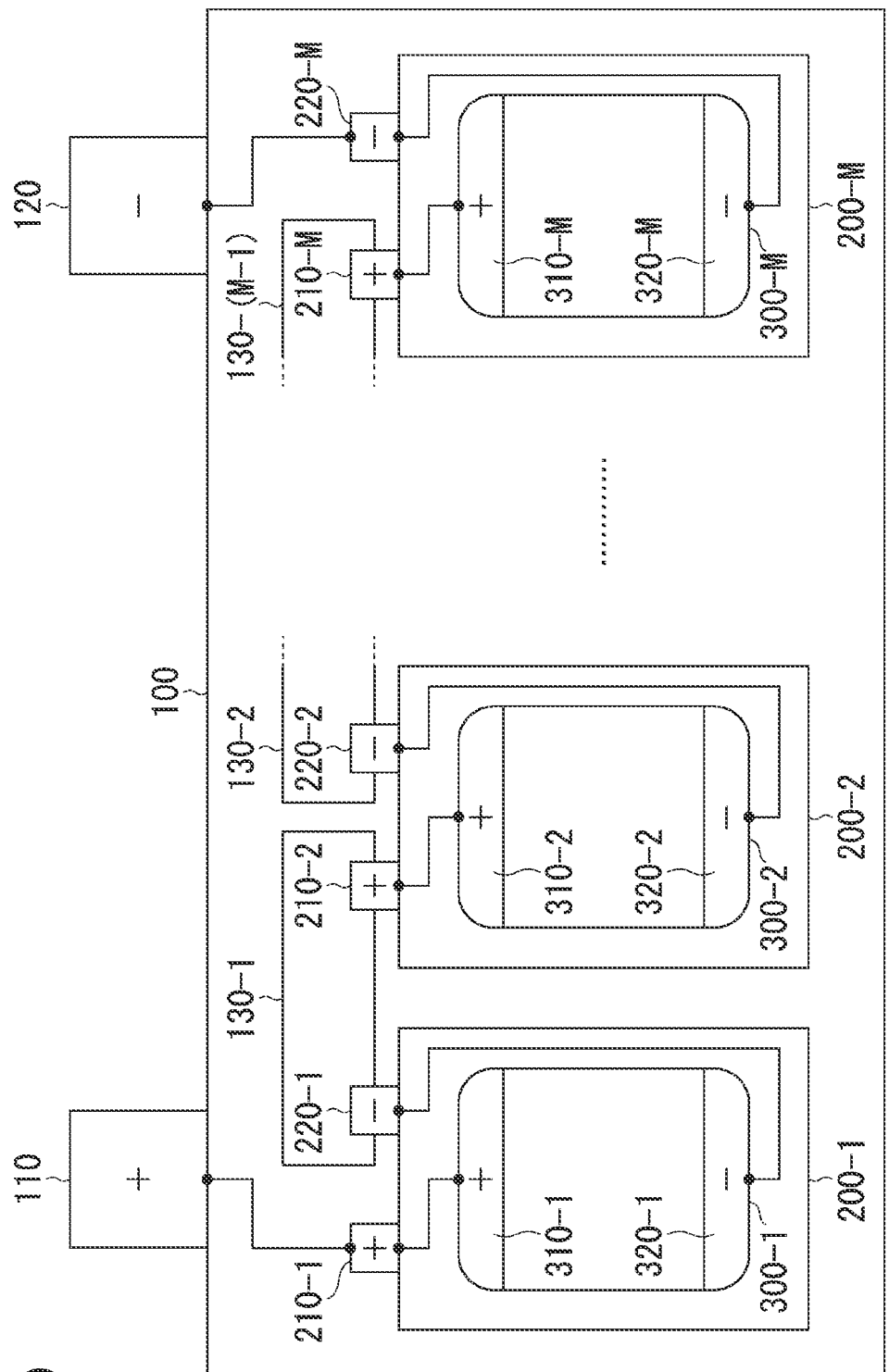
FIG. 10 is a diagram showing a configuration example of a battery.

FIG. 10 is a diagram showing an example of the battery 100 according to the second embodiment. The battery 100 is configured by connecting a plurality of battery cells 200 described in the first embodiment in series. The battery 100 includes a positive electrode terminal 110, a negative electrode terminal 120, one or more bus bars 130, and the plurality of battery cells 200. FIG. 10 shows battery cells 200-1 to 200-M as an example of the plurality of battery cells 200. M is an integer of 1 or more.

Each of the battery cells 200 has the wound electrode body 300 (wound body) and an electrolytic solution (not shown) therein and includes the positive electrode terminal 210 and the negative electrode terminal 220. A positive electrode terminal 210-1 of the battery cell 200-1 is connected to the positive electrode terminal 110 of the battery 100, and a negative electrode terminal 220-M of the battery cell 200-M is connected to the negative electrode terminal 120 of the battery 100. A positive electrode terminal 210-$i$ of a battery cell 200-$i$ ($2 \leq i \leq M$) is connected to a negative electrode terminal 220-$j$ of a battery cell 200-$j$ by a bus bar 130-$j$ ($j=i-1$). On the other hand, a negative electrode terminal 220-$k$ of a battery cell 200-$k$ ($1 \leq k \leq M-1$) is connected to a positive electrode terminal 210-1 of a battery cell 200-1 ($l=k+1$) by a bus bar 130-$k$.

Figure 11:
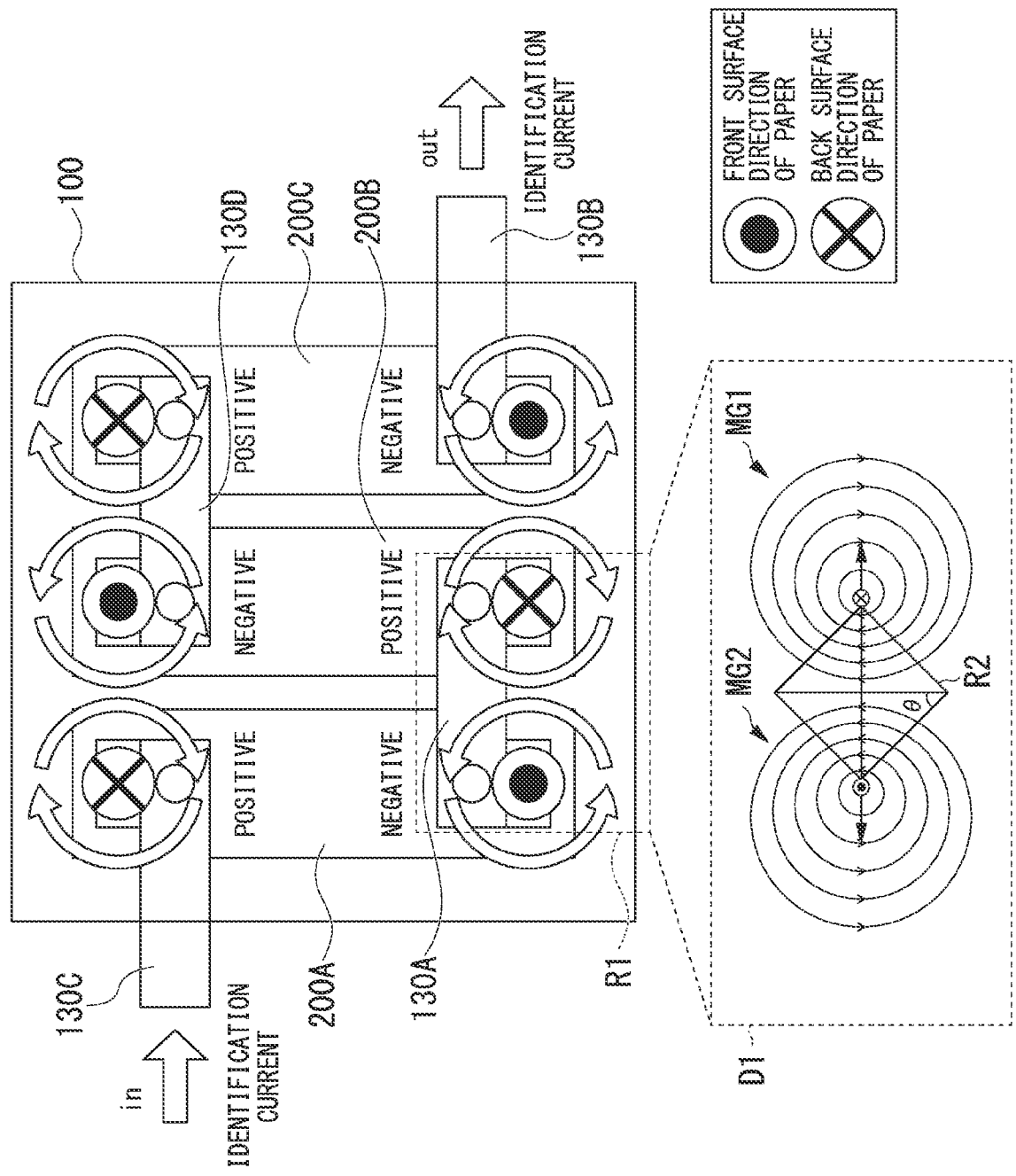
FIG. 11 is a diagram showing an example of connecting battery cells to each other in the battery.

FIG. 11 is a diagram showing a connection example of the battery cells 200 in the battery 100. By connecting the battery cells 200 to each other in the arrangement as shown in FIG. 11, a phenomenon occurs in which the magnetic field generated at the time of applying the identification current is amplified by strengthening each other at a specific position or is attenuated by weakening each other. Since such a phenomenon related to the magnetic field strength can be a feature for determining the battery type, the battery type determining device 400B of the second embodiment stores in advance the correspondence information table T2, in which the magnetic field characteristic having such a feature and the battery type are associated with each other, in the storage unit 440. Thus, the battery type determining device 400B can determine the battery type of the battery 100 based on the magnetic field characteristics observed when the identification current is applied to the battery 100.

Specifically, for example, in battery cells 200A and 200B of which a negative electrode and a positive electrode are connected to each other by a bus bar 130-A, the magnetic field characteristic generated in the vicinity R1 of a connection portion therebetween is as shown in a distribution diagram Dl. Here, since directions of the identification current flowing in the negative electrode and the positive electrode are different from each other, rotating magnetic fields MG1 and MG2 in opposite directions are generated according to the right-handed screw rule. In addition, in this case, if the angle θ is within 45 degrees for a region R2 between the negative electrode and the positive electrode, the magnetic fields MG1 and MG2 strengthen each other inside the region R2 and are amplified in a magnetic flux direction. Such amplification of the magnetic fields may change positions of the negative electrode and the positive electrode, as shown in FIG. 12 below.

Figure 12:
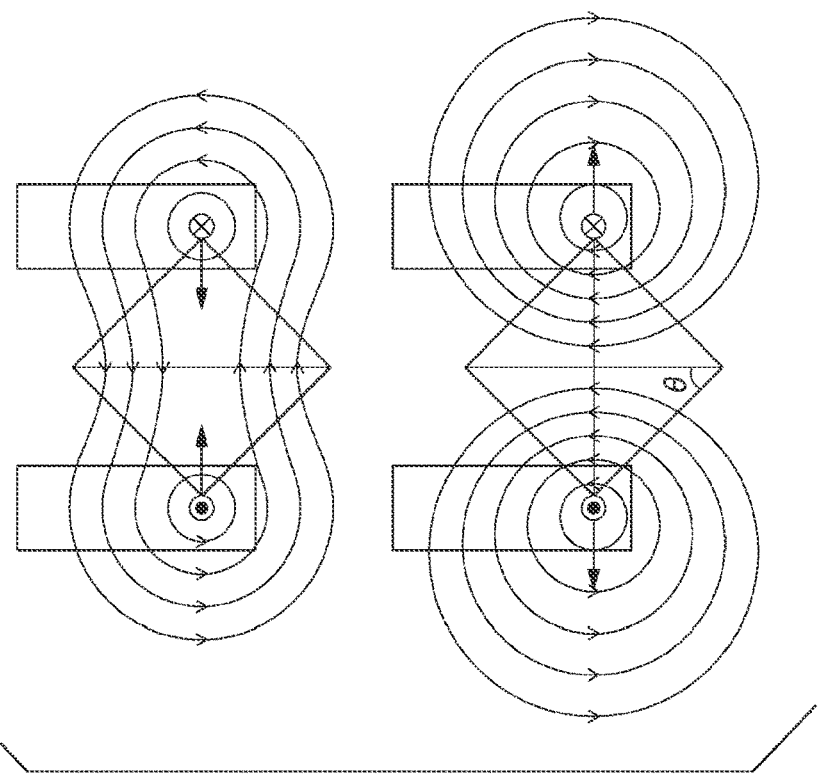
FIG. 12 is a diagram illustrating generation of an attractive force or a repulsive force in a positive electrode and a negative electrode depending on a direction of an identification current.

FIG. 12 is a diagram illustrating that an attractive force or a repulsive force is generated in the positive electrode and the negative electrode depending on directions of the identification current. First, as shown in the upper figure, when directions of currents flowing through the positive and negative electrodes are the same, magnetic fields having different directions weaken each other and the density of magnetic force lines decreases in the region between the positive electrode and the negative electrode, and thus in an attempt to cancel it, forces act on the negative electrode and the positive electrode to attract each other. In this case, the position of the negative electrode or the positive electrode may change due to the forces of attracting each other. On the other hand, as shown in the lower figure, in a case in which the directions of the currents flowing through the positive and negative electrodes are different from each other, magnetic fields having different directions strengthen each other and the density of the magnetic force lines increases in the region between the positive electrode and the negative electrode, and thus in an attempt to cancel it, forces act on the negative electrode and the positive electrode to move away from each other. In this case, the position of the negative electrode or the positive electrode may change due to the forces of moving away from each other.

Illustration of FIG. 11 will be referred to again. Since a strength of the magnetic field weakens as a distance thereof from the rotating axis (current direction) increases, the result when the magnetic field characteristic is observed from the outside of the battery 100 differs depending on a state of the arrangement of the battery cells 200 inside the battery 100. Since the arrangement of the battery cells 200 and the like are design matters when the battery 100 is manufactured, a difference in design may appear in the magnetic field characteristic depending on products.

Figure 13:
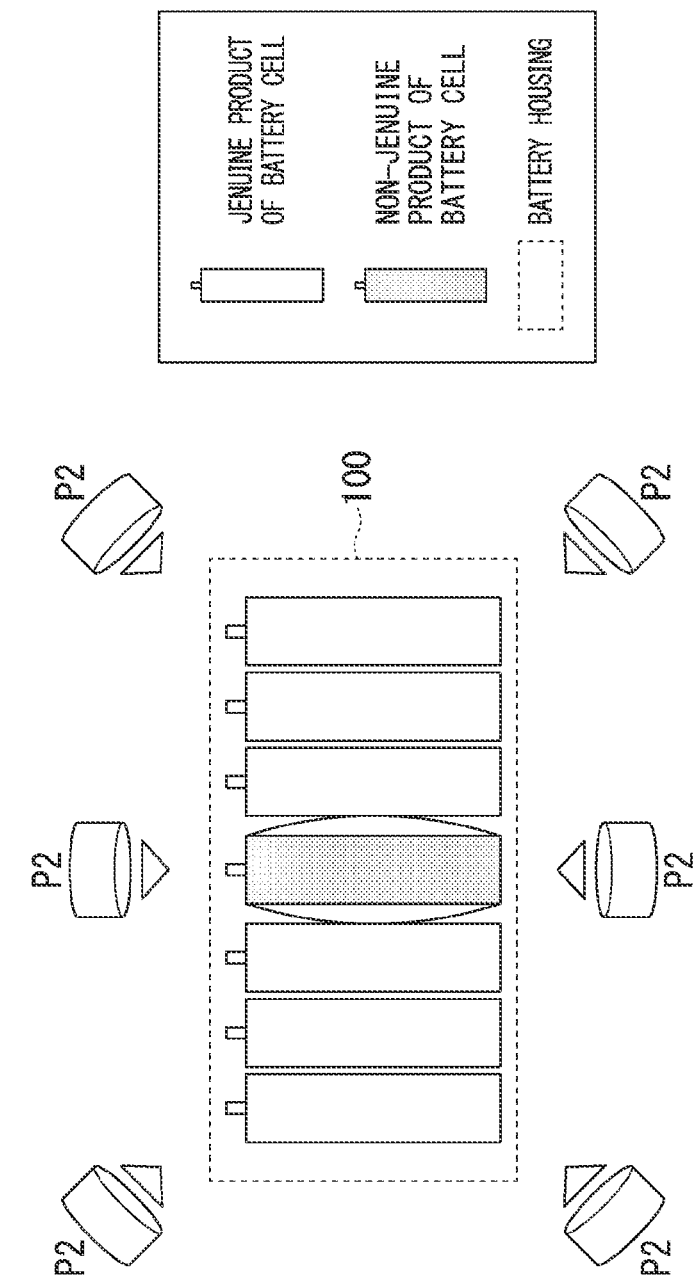
FIG. 13 is a diagram showing a state of detecting a non-genuine battery inside the battery.

The battery type determining device 400B of the present embodiment sores in advance the correspondence relationship between the magnetic field characteristic observed due to such a structural characteristic of the battery 100 and the battery type as the correspondence information table T2, and thus the battery type of the battery 100 can be determined based on the observation results of the magnetic field characteristic. According to such a configuration, for example, as shown in FIG. 13 below, even in a case in which a non-genuine battery cell is included in part of the plurality of battery cells 200 included in the battery 100, the non-genuine battery cell can be detected by observing the magnetic field characteristic of the battery 100 from a predetermined position outside a housing.

Figure 14:
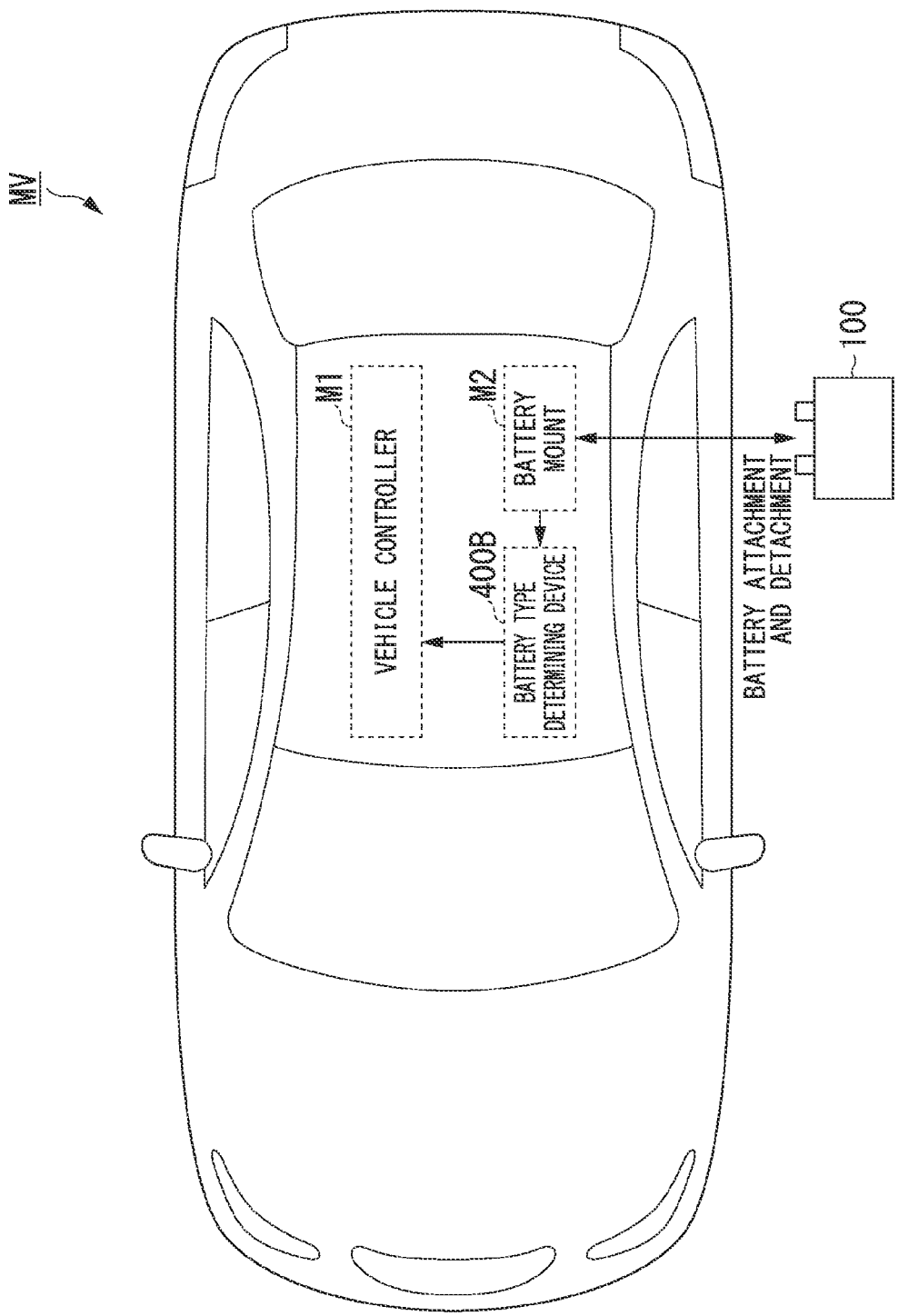
FIG. 14 is a diagram showing an application example of the battery type determining device according to the second embodiment.

FIG. 14 is a diagram showing an application example of the battery type determining device 400B of the second embodiment. FIG. 14 shows a vehicle M equipped with the battery type determining device 400B as the application example of the battery type determining device 400B. The vehicle M of FIG. 14 is assumed to be a four-wheel drive passenger car, but the vehicle equipped with the battery type determining device 400B may be any other vehicle as long as it uses the battery 100 as a power source. The vehicle M includes a vehicle controller M1 that controls each part of the vehicle, a battery mount M2 for mounting the battery 100 on the vehicle M, and the battery type determining device 400B that determines the battery type of the battery 100 mounted on the vehicle.

In this case, for example, as in the case of the first embodiment, the battery type determining device 400B performs determination on the battery type of the battery 100 mounted on the vehicle M and performs the normal time processing or abnormal time processing in accordance with the determination results. For example, in a case in which the battery 100 mounted on the vehicle M is determined to be a genuine product, the vehicle battery type determining device 400B may perform processing of giving permission to drive the vehicle M to both of the controllers M1 as the normal time processing. On the contrary, for example, in a case in which the battery 100 mounted on the own vehicle M is not determined to be a genuine product, the battery type determining device 400B may perform processing of instructing the vehicle controller M1 not to run the vehicle M as the abnormal time processing.

In this case, for example, the battery type determining device 400B may be configured such that the magnetic field characteristic measurer 430 measures and records the magnetic field characteristic when an engine of the vehicle M is turned off (an example of when electric power is turned off) as a previous magnetic field characteristic and measures a current magnetic field characteristic when the engine is turned on next (an example of when electric power is turned on), and the determiner 454 compares the previous magnetic field characteristic with the current magnetic field characteristic, thereby detecting a change of the battery. The vehicle M is an example of a "mobile object."

The battery type determining device 400B of the second embodiment configured in this way can apply the specific current to the target battery 100 for the battery 100 in which the battery cells 200 are integrated and determine the type of the target battery based on the magnetic field characteristic value observed as the response thereto. For that reason, according to the battery type determining device 400B of the embodiment, it is possible to determine the type of the target battery 100 without attaching an identification component.

In the above embodiments, it has been explained that it is mainly determined whether the battery type is a genuine product or not, but the magnetic field characteristic value generated when the identification current is applied may change even in a case in which an abnormality occurs in the battery cells 200 inside the battery 100, and thus by associating such a change in the magnetic field characteristic value with the type of the abnormality and storing them in the correspondence information table T2, it is also possible to use the battery type determining device 400A or 400B (hereinafter, collectively referred to as a battery type determining device 400) to detect the abnormality in the battery 100 or the battery cells 200.

According to the battery type determining device 400 described in the above embodiments, it is possible to identify the battery type even for a battery (or a battery cell) that is not equipped with an IC chip or the like that can output an identification signal. For that reason, it is not always necessary to mount the IC chip on the battery, and it is possible to solve problems of the battery caused by an interface and durability of the IC chip.

The battery type determining device 400 described in the above embodiments is applicable to determination of a battery type of any battery other than a vehicle battery as long as it is a battery from which the magnetic field characteristic that enables identification of the battery type in advance can be measured. For example, the battery type determining device 400 may be configured to determine a battery type of a so-called mobile power pack (MPP), which is a removable portable battery that can be used as a power source for small electric mobility or as a power source at home. For example, the battery type determining device 400 may be provided in a battery charging device or a battery returning device (a so-called battery exchanger (BEX)) that collects and charges used MPPs and makes the charged MPPs rentable again. The battery type determining device 400 may be integrally configured with these MPPs and BEXs, or may be configured separately.

Aspects for carrying out the present invention have been described above using the embodiments, but the present invention is not limited to these embodiments, and various modifications and substitutions can be added thereto without departing from the gist of the present invention.

What is claimed is:

1. A battery type determining device comprising:
a storage device configured to store a program and a specified value of a magnetic field characteristic in accordance with a type of a battery;
a hardware processor; and
a magnetic field characteristic measuring device configured to measure the magnetic field characteristic generated in the battery,
wherein the hardware processor executes the program stored in the storage device to instruct a current application circuit to apply a specific current to the battery having a current collector and a wound body or laminate, causes the magnetic field characteristic measuring device to measure the magnetic field characteristic generated in the battery due to the application of the specific current, and compares the specified value with a measured value of the magnetic field characteristic measuring device to determine the type of the battery, and
the magnetic field characteristic measuring device measures a magnetic field generated by an electric current flowing through the current collector of the battery.

2. The battery type determining device according to claim 1, wherein the magnetic field characteristic measuring device measures the magnetic field generated by the electric current flowing through a connection portion between the current collector and the wound body or laminate.

3. The battery type determining device according to claim 1,
wherein the battery or the battery cell group, the magnetic field characteristic measuring device, and the hardware processor are mounted on a mobile object,
the magnetic field characteristic measuring device records a previous magnetic field characteristic measured when electric power of the mobile object is turned off and measures a current magnetic field characteristic when the electric power is turned on next, and
the hardware processor compares the previous magnetic field characteristic with the current magnetic field characteristic to detect a change in the battery or the battery cell group.

4. The battery type determining device according to claim 1, wherein the specific current is a sine wave or a square wave.

5. A battery type determining device comprising:
a storage device configured to store a program and a specified value of a magnetic field characteristic in accordance with a type of a battery cell group;
a hardware processor; and
a magnetic field characteristic measuring device configured to measure the magnetic field characteristic generated in the battery cell group in which battery cells each having a current collector and a wound body or laminate are laminated in a predetermined direction,
wherein the hardware processor executes the program stored in the storage device to instruct a current application circuit to apply a specific current to the battery cell group, causes the magnetic field characteristic measuring device to measure the magnetic field characteristic generated in the battery cell group due to the application of the specific current, and compares the specified value with a measured value of the magnetic field characteristic measuring device to determine the type of the battery cell group, and
the magnetic field characteristic measuring device is disposed in a region in which a magnetic field generated by an electric current flowing through current collectors of adjacent battery cells is amplified.

6. The battery type determining device according to claim 5,
wherein the battery or the battery cell group, the magnetic field characteristic measuring device, and the hardware processor are mounted on a mobile object,
the magnetic field characteristic measuring device records a previous magnetic field characteristic measured when electric power of the mobile object is turned off and measures a current magnetic field characteristic when the electric power is turned on next, and
the hardware processor compares the previous magnetic field characteristic with the current magnetic field characteristic to detect a change in the battery or the battery cell group.

7. The battery type determining device according to claim 5, wherein the specific current is a sine wave or a square wave.

8. A battery type determining method comprising steps, executed by a computer, of:
instructing a current application circuit to apply a specific current to a battery having a current collector and a wound body or laminate;
causing a magnetic field characteristic measuring device to measure a magnetic field characteristic generated in the battery due to the application of the current;
comparing a specified value of the magnetic field characteristic in accordance with a type of the battery with a measured value of the magnetic field characteristic generated in the battery due to application of the current to determine the type of the battery; and
causing the magnetic field characteristic measuring device to measure a magnetic field generated by an electric current flowing through the current collector of the battery as the magnetic field characteristic.

9. A battery type determining method comprising steps, executed by a computer, of:
instructing a current application circuit to apply a specific current to a battery cell group in which battery cells each having a current collector and a wound body or laminate are laminated in a predetermined direction;
causing a magnetic field characteristic measuring device to measure a magnetic field characteristic generated in the battery cell group due to the application of the current;
comparing a specified value of the magnetic field characteristic in accordance with a type of the battery cell group with a measured value of the magnetic field characteristic generated in the battery cell group due to application of the current to determine the type of the battery cell group; and
causing the magnetic field characteristic measuring device to measure a magnetic field in a region in which the magnetic field generated by an electric current flowing through current collectors of adjacent battery cells is amplified as the magnetic field characteristic.

* * * * *